(12) United States Patent
Wang et al.

(10) Patent No.: US 7,956,373 B2
(45) Date of Patent: Jun. 7, 2011

(54) SEMICONDUCTOR LIGHT-EMITTING DEVICE WITH HIGH LIGHT-EXTRACTION EFFICIENCY

(75) Inventors: Wei-Kai Wang, Shengang Township, Taichung County (TW); Su-Hui Lin, Taichung (TW); Wen-Chung Shih, Tai-Ping (TW)

(73) Assignee: Huga Optotech, Inc., Taichung (TW)

( * ) Notice: Subject to any disclaimer, the term of this patent is extended or adjusted under 35 U.S.C. 154(b) by 480 days.

(21) Appl. No.: 12/081,595

(22) Filed: Apr. 17, 2008

(65) Prior Publication Data
US 2008/0258163 A1    Oct. 23, 2008

(30) Foreign Application Priority Data

Apr. 20, 2007    (TW) ................................. 96113911 A

(51) Int. Cl.
*H01L 33/00*    (2010.01)

(52) U.S. Cl. ........... 257/98; 257/E33.067; 257/E33.074; 257/E21.214

(58) Field of Classification Search ..................... 257/98, 257/E33.067, E33.074
See application file for complete search history.

(56) References Cited

U.S. PATENT DOCUMENTS

| | | | |
|---|---|---|---|
| 5,214,306 A * | 5/1993 | Hashimoto | .................... 257/632 |
| 5,481,122 A * | 1/1996 | Jou et al. | ........................... 257/94 |
| 6,177,352 B1 * | 1/2001 | Schonfeld et al. | ............ 438/701 |
| 6,277,665 B1 | 8/2001 | Ma et al. | |
| 2002/0056848 A1 * | 5/2002 | Wirth | ............................... 257/98 |
| 2003/0062529 A1 * | 4/2003 | Kato et al. | ........................ 257/79 |
| 2004/0070004 A1 * | 4/2004 | Eliashevich et al. | ........... 257/200 |
| 2005/0017258 A1 * | 1/2005 | Fehrer et al. | ..................... 257/98 |
| 2006/0204865 A1 * | 9/2006 | Erchak et al. | ...................... 430/7 |
| 2006/0267027 A1 * | 11/2006 | Lai et al. | ........................... 257/79 |
| 2007/0224714 A1 * | 9/2007 | Ikeda et al. | ...................... 438/26 |
| 2009/0026468 A1 * | 1/2009 | Sakai et al. | ...................... 257/88 |

* cited by examiner

*Primary Examiner* — Angel Roman
(74) *Attorney, Agent, or Firm* — Jianq Chyun IP Office

(57) ABSTRACT

The invention discloses a semiconductor light-emitting device and a fabricating method thereof. The semiconductor light-emitting device according to the invention includes a substrate, a multi-layer structure, a top-most layer, and at least one electrode. The multi-layer structure is formed on the substrate and includes a light-emitting region. The top-most layer is formed on the multi-layer structure, and the lower part of the sidewall of the top-most layer exhibits a first surface morphology relative to a first pattern. In addition, the upper part of the sidewall of the top-most layer exhibits a second surface morphology relative to a second pattern. The first pattern is different from the second pattern. The at least one electrode is formed on the top-most layer. Therefore, the sidewall of the semiconductor light-emitting device according to the invention exhibits a surface morphology, which increases the light extraction area of the sidewall, and consequently enhances the light extraction efficiency of the semiconductor light-emitting device.

10 Claims, 3 Drawing Sheets

SEMICONDUCTOR LIGHT-EMITTING DEVICE WITH HIGH LIGHT-EXTRACTION EFFICIENCY

BACKGROUND OF THE INVENTION

1. Field of the Invention

The present invention relates to a semiconductor light-emitting device, and more particularly, to a semiconductor light-emitting device with high light-extraction efficiency.

2. Description of the Prior Art

The current semiconductor light-emitting devices, such as light-emitting diodes, have been used for a wide variety of applications, e.g. illumination, remote control. To ensure high functional reliability as great as possible and a low power requirement of the semiconductor light-emitting devices, the external quantum efficiency is required for the devices.

In principle, the external quantum efficiency of a semiconductor light-emitting device is determined both by the internal quantum efficiency and extraction efficiency. The internal quantum efficiency is determined by the material property and quality. The extraction efficiency refers to the proportion of radiation emitted from the interior of the device into surrounding air or encapsulating epoxy. The extraction efficiency is determined by the losses occurred when radiation leaves the interior of the device. One of the main causes for such losses is the radiation proportion resulted from the high optical refraction coefficient of the semiconductor material, e.g. about 3.6 for gallium arsenide (GaAs), that cannot be emitted outside at the semiconductor surface on account of total reflection.

Regarding the manufacturing processes of semiconductor light-emitting devices in the prior art, e.g. U.S. Pat. No. 6,277,665, it disclosed a surface roughening method to enhance the external quantum efficiency of a semiconductor light-emitting device. According to the semiconductor light-emitting device in the patent, the exposed portion of its top-most layer exhibits a textured surface morphology, and thereby the external quantum efficiency of the semiconductor light-emitting device is enhanced.

Currently, the scope of a light-emitting diode is designed to be a straight type. If the scope, i.e. the sidewall, of the light-emitting diode forms a regular or an irregular surface morphology, the light-extraction area of the sidewall will be increased to enhance the light-extraction efficiency and the external quantum efficiency of the semiconductor light-emitting device.

Therefore, the main scope of the invention is to provide a semiconductor light-emitting device with a sidewall exhibiting a surface morphology. Thereby, the light-emitting area of the sidewall is increased to enhance the light-extraction efficiency of the semiconductor light-emitting device.

SUMMARY OF THE INVENTION

One scope of the invention is to provide a semiconductor light-emitting device and a fabricating method thereof.

According to a preferred embodiment of the invention, the semiconductor light-emitting device includes a substrate, a multi-layer structure, a top-most layer, and at least one electrode.

The multi-layer structure is formed on the substrate and includes a light-emitting region. The top-most layer is formed on the multi-layer structure, and the lower part of the sidewall of the top-most layer exhibits a first surface morphology relative to a first pattern. In addition, the upper part of the sidewall of the top-most layer exhibits a second surface morphology relative to a second pattern. The first pattern is different from the second pattern. The at least one electrode is formed on the top-most layer and the multi-layer structure.

Therefore, the sidewall of the semiconductor light-emitting device according to the invention exhibits a surface morphology, which increases the light-extraction area of the sidewall, and consequently enhances the light-extraction efficiency and the external quantum efficiency of the semiconductor light-emitting device.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
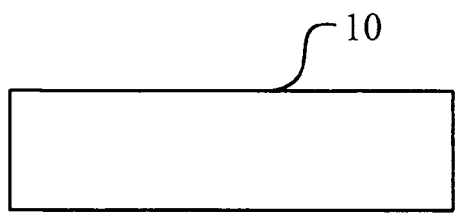
FIGS. 1A through 1D show the local sidewalls with various surface morphologies of a light-emitting diode.
Figure 1B:
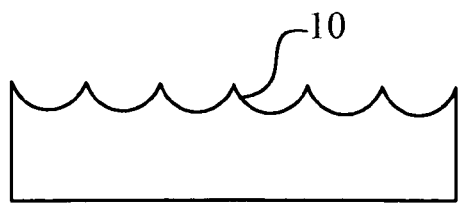
Figure 1C:
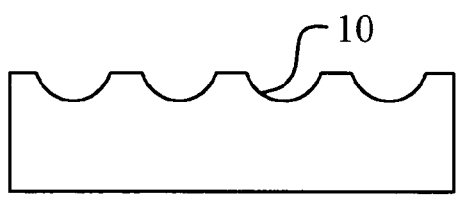
Figure 1D:
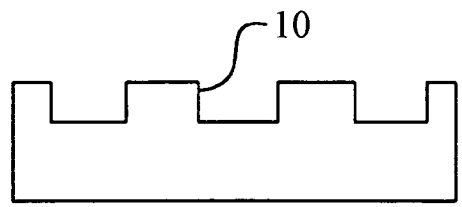

Please refer to Table 1. Table 1 lists the tested results of the external scope, light-emitting strength and electrical performances of a light-emitting diode having a sidewall with various surface morphologies. Please refer to FIGS. 1A through 1D. FIGS. 1A through 1D show the local sidewalls 10 with various surface morphologies of a light-emitting diode. FIG. 1A shows a sidewall 10 without a treatment, i.e. a straight-type sidewall 10. FIGS. 1B through 1D show sidewalls 10 with various surface morphologies.

TABLE 1

| surface morphology | periphery (μm) | light-emitting strength (mcd) | output power (mW) | external quantum efficiency (%) |
|---|---|---|---|---|
| FIG. 1A | 1677 | 127.2 | 8.5 | 12.8 |
| FIG. 1B | 2538.98 | 131.6 | 8.89 | 13.4 |
| FIG. 1C | 2104.64 | 134.3 | 8.67 | 13 |
| FIG. 1D | 2186.8 | 133.8 | 8.79 | 13.3 |

As shown in Table 1, the sidewalls 10 with various surface morphologies, as shown in FIGS. 1B through 1D, have a longer periphery than the sidewall 10 without the treatment. Thereby, the light-extraction area of the sidewall 10 of the light-emitting diode is increased greatly. Thus, as shown in Table 1, light-emitting diodes having the sidewalls 10 with various surface morphologies have better performances on the light-emitting strength, output power and external quantum efficiency than light-emitting diodes having the sidewalls 10 without the treatment. It is noted that 20 mA current is inputted to light-emitting diodes for measuring the electrical performances. It is proved that if the periphery of a light-emitting diode forms a surface morphology, the light-extraction area of the sidewall of the light-emitting diode is increased so as to increase the light-extraction efficiency and the external quantum efficiency of the light-emitting diode.

Figure 2:
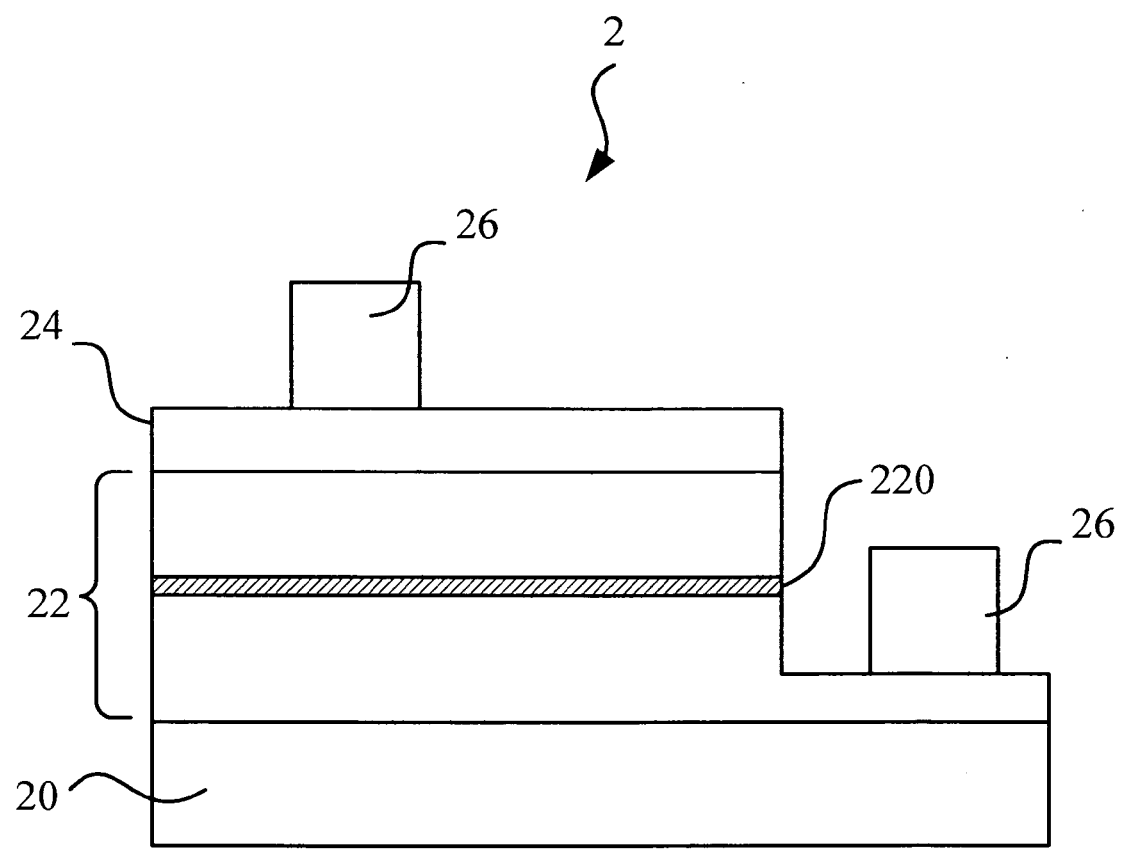
FIG. 2 is the sectional view of a semiconductor light-emitting device according to a preferred embodiment of the invention.

Please refer to FIG. 2. FIG. 2 is the sectional view of a semiconductor light-emitting device 2 according to a preferred embodiment of the invention. In the embodiment, the semiconductor light-emitting device 2 can be a diode light-emitting device. As shown in FIG. 2, the semiconductor light-emitting device 2 includes a substrate 20, a multi-layer structure 22, a top-most layer 24, and at least one electrode 26.

In practical applications, the substrate 20 can be Si, GaN, AlN, sapphire, spinnel, SiC, GaAs, $Al_2O_3$, $LiGaO_2$, $LiAlO_2$, $MgAl_2O_4$ or an electrically conductive material.

The multi-layer structure 22 is formed on the substrate 20 and includes a light-emitting region 220. In practical applications, the light-emitting region 220 can include a PN-junction, a double hetero-junction or a multiple quantum well.

The top-most layer 24, i.e. a transparent contact layer, is formed on the multi-layer structure 22. The at least one electrode 26 is formed on the top-most layer 24 and the multi-layer structure 22. In practical applications, the top-most layer 24 can be formed of Indium-Tin oxide (ITO) or Zinc oxide.

Figure 3:
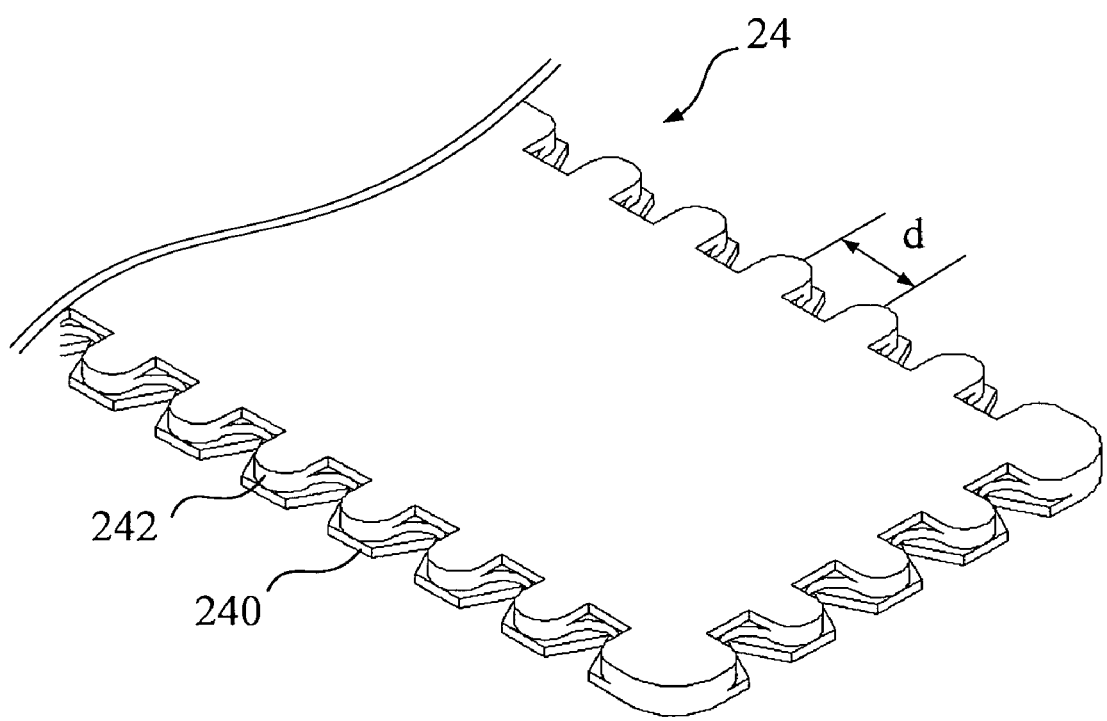
FIG. 3 is the possible surface morphology of the sidewall of the semiconductor light-emitting device according to the invention in FIG. 2.

Please refer to FIG. 3. FIG. 3 is the possible surface morphology of the sidewall of the semiconductor light-emitting device 2 according to the invention in FIG. 2. As shown in FIG. 3, in the embodiment, the lower part 240 of the sidewall of the top-most layer 24 exhibits a first surface morphology relative to a first pattern. In practical applications, the first surface morphology of the sidewall of the top-most layer 24, i.e. the lower part 240, can be formed by use of an etching-resistant layer. The etching-resistant layer can be formed of silicon oxide or a photo-resist material, and the boundary of the etching-resistant layer can exhibit the first pattern.

In addition, the upper part 242 of the sidewall of the top-most layer 24 can exhibit a second surface morphology relative to a second pattern. Similarly, the second surface morphology of the sidewall of the top-most layer 24, i.e. the upper part 242, can be formed by use of the etching-resistant layer and according to the second pattern. It should be noted that the second pattern is formed by reducing the first pattern of the boundary of the etching-resistant layer. Therefore, the first pattern is different from the second pattern.

As shown in FIG. 3, the sidewall of the semiconductor light-emitting device in the embodiment shows a regular surface morphology. The surface morphology of the sidewall can be formed by multiple photolithographic and etching processes, and is not limited by the upper part 242 and the lower part 240 in the embodiment. In other words, the sidewall can include multiple portions, and each portion has a particular surface morphology.

In practical applications, the sidewall of the substrate 20 can exhibit a surface morphology relative to a third pattern, and the sidewall of the multi-layer structure 22 can exhibit a surface morphology relative to a fourth pattern. In other words, the whole sidewall of the semiconductor light-emitting device 2 can exhibit a surface morphology to enhance the light-extraction efficiency and the external quantum efficiency of the semiconductor light-emitting device 2.

In practical applications, the etching-resistant layer can be formed of nickel, aluminum or other metal materials with the property of forming a sphere by cohesion under a thermal treatment and being more resistant to etching than the materials which will be etched. In the embodiment, nickel is taken as an exemplification. Because nickel will form nano-scaled structures under an annealing process, nickel can serve for the etching-resistant layer of the semiconductor light-emitting device 2. Thereby, performing an annealing process on the etching-resistant layer of nickel can form the boundary of the etching-resistant layer with the pattern which can be irregular. It should be noted that the pattern of the boundary is related to the conditions of the annealing process.

In practical applications, FIG. 3 can be an exemplification of the dimension of the sidewall of the semiconductor light-emitting device 2 according to the invention. The size of single sidewall and the pitch d between adjacent sidewalls can be defined in a range of 0.1~10 μm. However, with the development of the semiconductor manufacturing process, the size of single sidewall and the pitch d between adjacent sidewalls can be reduced gradually to greatly increase the light-extraction area of the sidewall of the semiconductor light-emitting device 2.

In one embodiment, if the substrate 20 is made of an electrically conductive material, the semiconductor light-emitting device 2 formed on the substrate 20 can be extended to a semiconductor light-emitting device 2 with electrodes 26 on an upper surface and on a lower surface thereof, respectively, i.e. a vertical-structured semiconductor light-emitting device 2 (not shown in FIG. 2). Comparatively, the at least one electrode 26 of the semiconductor light-emitting device 2 in FIG. 2 is formed on the top-most layer 24 and the multi-layer structure 22, i.e. a horizontal-structured semiconductor light-emitting device 2. In other words, the at least one electrode 26 of the semiconductor light-emitting device 2 according to the invention is not necessarily formed on a same surface.

For the need of manufacturing the semiconductor light-emitting device 2, the substrate 20 is a required element, but the substrate 20 can be selectively removed after the formation of the semiconductor light-emitting device 2. Besides, the top-most layer 24 is just used to enhance the efficiency of the semiconductor light-emitting device 2, but not required. Therefore, in another embodiment, the semiconductor light-emitting device 2 according to the invention can exclude the substrate 20 and the top-most layer 24.

In another embodiment, the first pattern of the boundary of the etching-resistant layer can exhibit a circle, a semi-circle, a triangle, a polygon or a combination of the above-mentioned patterns. Thereby, the top-most layer 24 can use the above-mentioned etching-resistant layer with a specific pattern to form a sidewall with a corresponding surface morphology through a photolithographic process and an etching process.

According to another preferred embodiment of the invention is related to a method of fabricating a semiconductor light-emitting device.

Please refer to FIG. 2 again. First, the method prepares a substrate 20. Then, the method forms a multi-layer structure 22 on the substrate 20, and the multi-layer structure 22 includes a light-emitting region 220. Subsequently, the method forms a top-most layer 24 on the multi-layer structure 22.

Next, the method forms an etching-resistant layer substantially overlaying the top-most layer 24 such that the boundary of the top-most layer 24 is exposed. The boundary of the etching-resistant layer exhibits a first pattern. Subsequently, the method etches the exposed boundary of the top-most layer 24. Next, the method reduces the boundary of the etching-resistant layer such that the boundary of the etching-resistant layer exhibits a second pattern. The first pattern is different from the second pattern. Then, the method etches the exposed boundary of the top-most layer 24 once more.

Finally, the method removes the etching-resistant layer and forms at least one electrode 26 on the top-most layer 24 and on the multi-layer structure 22.

Compared to the prior art, the sidewall of the semiconductor light-emitting device according to the invention can exhibit a regular or an irregular surface morphology. Although the ordinary light-emitting area is reduced, the light-extraction area of the sidewall is increased so as to increase the light-extraction efficiency and the external quantum efficiency of the semiconductor light-emitting device.

Besides, the present invention can be applied to various semiconductor light-emitting devices and various sorts of light.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light-emitting device, comprising:
a substrate;
a multi-layer structure, formed on the substrate, comprising a light-emitting region;
a top-most layer, formed on the multi-layer structure, the lower part of the sidewall of the top-most layer exhibiting a first surface morphology relative to a first pattern, the upper part of the sidewall of the top-most layer exhibiting a second surface morphology relative to a second pattern, the first pattern being different from the second pattern; and
at least one electrode, formed on the top-most layer and on the multi-layer structure.

2. The semiconductor light-emitting device of claim 1, wherein the top-most layer is formed of Indium-Tin oxide (ITO) or Zinc oxide.

3. The semiconductor light-emitting device of claim 1, wherein the light-emitting region comprises one selected from the group consisting of a PN-junction, a double hetero junction and a multiple quantum well.

4. The semiconductor light-emitting device of claim 1, wherein the substrate is formed of a material selected from the group consisting of Si, GaN, AlN, sapphire, spinnel, SiC, GaAs, $Al_2O_3$, $LiGaO_2$, $LiAlO_2$, and $MgAl_2O_4$.

5. The semiconductor light-emitting device of claim 1, wherein the first surface morphology of the sidewall of the top-most layer is formed by use of an etching-resistant layer whose boundary exhibits the first pattern.

6. The semiconductor light-emitting device of claim 5, wherein the etching-resistant layer is formed of silicon oxide or a photo-resist material.

7. The semiconductor light-emitting device of claim 5, wherein the etching-resistant layer is formed of nickel or aluminum.

8. The semiconductor light-emitting device of claim 7, wherein the boundary of the etching-resistant layer with the first pattern is formed by an annealing process.

9. The semiconductor light-emitting device of claim 1, wherein the sidewall of the substrate exhibits a surface morphology relative to a third pattern.

10. The semiconductor light-emitting device of claim 1, wherein the sidewall of the multi-layer structure exhibits a surface morphology relative to a fourth pattern.

* * * * *